(12) United States Patent
Kim et al.

(10) Patent No.: US 12,620,451 B2
(45) Date of Patent: May 5, 2026

(54) MEMORY SYSTEM, DEBUGGING DEVICE, DEBUGGING METHOD OF MEMORY SYSTEM, AND METHOD OF OPERATING MEMORY SYSTEM

(71) Applicant: SAMSUNG ELECTRONICS CO., LTD., Suwon-si (KR)

(72) Inventors: Bumju Kim, Suwon-si (KR); Jaecheon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/600,070

(22) Filed: Mar. 8, 2024

(65) Prior Publication Data

US 2024/0304270 A1 Sep. 12, 2024

(30) Foreign Application Priority Data

Mar. 9, 2023 (KR) ........................ 10-2023-0031364

(51) Int. Cl.
*G11C 29/14* (2006.01)

(52) U.S. Cl.
CPC .................................... *G11C 29/14* (2013.01)

(58) Field of Classification Search
None
See application file for complete search history.

(56) References Cited

U.S. PATENT DOCUMENTS

| | | | | |
|---|---|---|---|---|
| 5,717,702 | A | * | 2/1998 | Stokes ........... G01R 31/318536 |
| | | | | 714/730 |
| 5,923,675 | A | | 7/1999 | Brown et al. |
| 7,707,472 | B1 | * | 4/2010 | Dastidar ................ G11C 29/16 |
| | | | | 714/733 |
| 8,275,579 | B2 | | 9/2012 | Stevens et al. |
| 9,465,073 | B2 | | 10/2016 | Kim |
| 9,568,550 | B1 | * | 2/2017 | Kundu ........... G01R 31/318566 |
| 10,295,597 | B2 | | 5/2019 | Maeda et al. |
| 10,908,213 | B1 | * | 2/2021 | Gizdarski ...... G01R 31/318583 |
| 11,204,857 | B2 | | 12/2021 | Woo |
| 2005/0154947 | A1 | | 7/2005 | Taniguchi |
| 2005/0229061 | A1 | * | 10/2005 | Kang .................... G06F 11/263 |
| | | | | 714/738 |
| 2011/0231719 | A1 | * | 9/2011 | Kim ............... G01R 31/318544 |
| | | | | 714/E11.155 |
| 2014/0082453 | A1 | * | 3/2014 | Sikdar ................... G06F 11/108 |
| | | | | 714/763 |
| 2018/0095863 | A1 | | 4/2018 | Woo |
| 2020/0258590 | A1 | * | 8/2020 | Spica .................... G11C 29/38 |

FOREIGN PATENT DOCUMENTS

| | | | |
|---|---|---|---|
| JP | 2012-208000 A | 10/2012 | |
| KR | 10-2015-0026202 A | 3/2015 | |
| WO | WO-2004072660 A2 * | 8/2004 | ..... G01R 31/318547 |

* cited by examiner

*Primary Examiner* — Guerrier Merant
(74) *Attorney, Agent, or Firm* — Sughrue Mion, PLLC

(57) ABSTRACT

A memory system includes: a memory device configured to store a plurality of data items; a scan chain configured to receive the plurality of data items and to generate scan-out data for the plurality of data items; and a controller configured to replace the scan-out data with replaced data. The scan chain is further configured to receive the replaced data from the controller.

19 Claims, 12 Drawing Sheets

| Data | 0 | 1 | 1 | 0 | 0 | 0 | 1 | 1 |
|---|---|---|---|---|---|---|---|---|
| Data_Replace | 1 | 0 | 0 | 1 | 1 | 1 | 0 | 0 |

FIG. 9

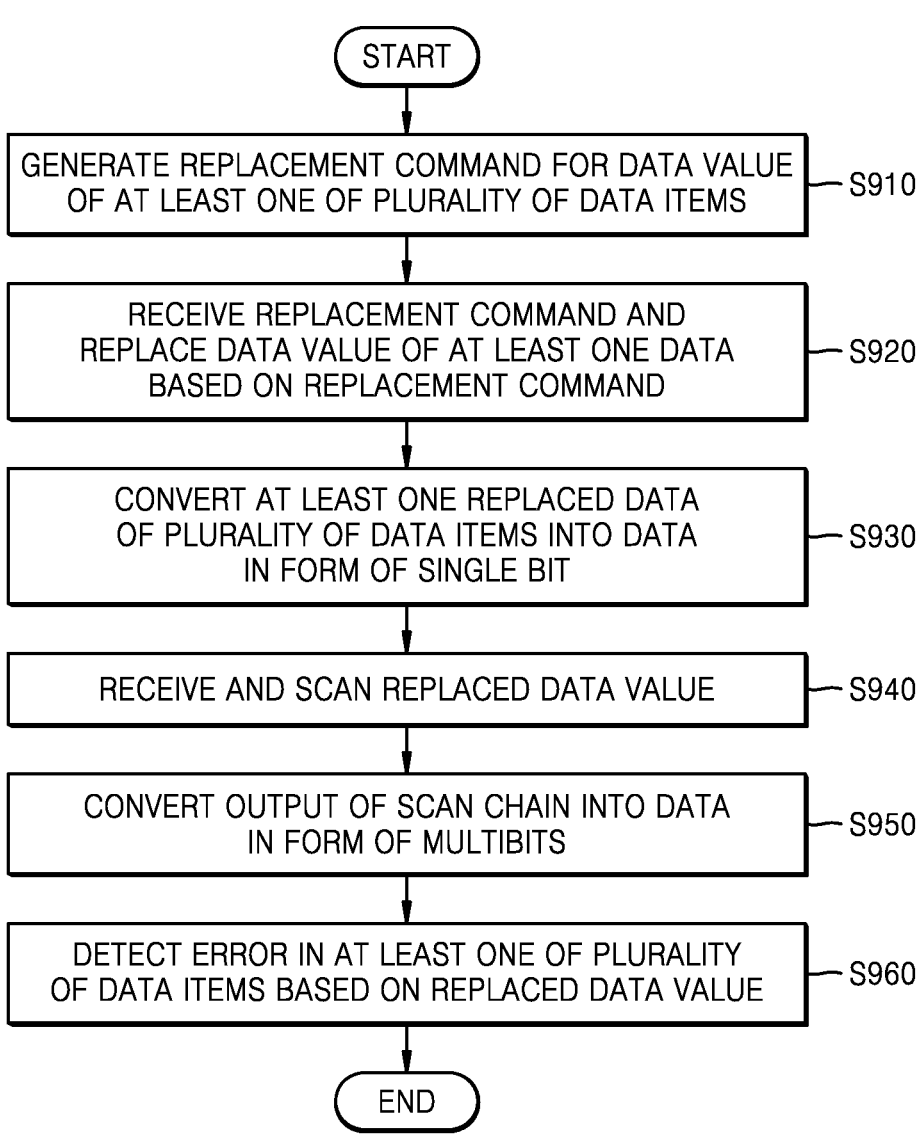

START

GENERATE REPLACEMENT COMMAND FOR DATA VALUE OF AT LEAST ONE OF PLURALITY OF DATA ITEMS ── S910

RECEIVE REPLACEMENT COMMAND AND REPLACE DATA VALUE OF AT LEAST ONE DATA BASED ON REPLACEMENT COMMAND ── S920

CONVERT AT LEAST ONE REPLACED DATA OF PLURALITY OF DATA ITEMS INTO DATA IN FORM OF SINGLE BIT ── S930

RECEIVE AND SCAN REPLACED DATA VALUE ── S940

CONVERT OUTPUT OF SCAN CHAIN INTO DATA IN FORM OF MULTIBITS ── S950

DETECT ERROR IN AT LEAST ONE OF PLURALITY OF DATA ITEMS BASED ON REPLACED DATA VALUE ── S960

END

MEMORY SYSTEM, DEBUGGING DEVICE, DEBUGGING METHOD OF MEMORY SYSTEM, AND METHOD OF OPERATING MEMORY SYSTEM

CROSS-REFERENCE TO RELATED APPLICATION

This application is based on and claims priority under 35 U.S.C. § 119 to Korean Patent Application No. 10-2023-0031364, filed on Mar. 9, 2023, in the Korean Intellectual Property Office, the disclosure of which is incorporated by reference herein in its entirety.

BACKGROUND

1. Field

The disclosure relates to a memory system, a debugging device, a debugging method of a memory system, and a method of operating a memory system, and more particularly, to a debugging device and method for detecting an error in data by replacing a data value with another data value based on an error existing in at least one of a plurality of data items.

2. Description of Relate Art

In a conventional scan-dump method of a memory system, the same sequence as a previous sequence may be repeatedly used for debugging when the same scenario is tested after values loaded in a scan chain are shifted out. In addition, in a conventional debugging method of the memory system, an error may be detected by extracting data items loaded in the scan chain to the outside, or a flip-flop included in the scan chain may be reconstructed by providing an output of the scan chain to an input of the scan chain.

However, the conventional scan-dump method and the conventional debugging method may take a lot of time and has a problem in that a plurality of flip-flops may not be reconstructed at once.

SUMMARY

Provided are a method and a memory system performing a debugging operation by replacing a data value stored in a memory device and inputting the replaced data value to a scan chain based on an error existing in data having the data value.

Provided are a method and a memory system capable of detecting an error in data by replacing only a part or a data value in the data, which is suspicious of having an error, and thus, reducing time required for detecting the error.

According to one aspect of the disclosure, a memory device configured to store a plurality of data items; a scan chain configured to receive the plurality of data items and to generate scan-out data for the plurality of data items; and a controller configured to replace the scan-out data with replaced data. The scan chain is further configured to receive the replaced data from the controller.

According to another aspect of the disclosure, a debugging method of a memory system for detecting an error in at least one data item of a plurality of data items, includes: receiving the plurality of data items; generating scan-out data for the plurality of data items; and replacing the scan-out data with replaced data, wherein the generating of the scan-out data includes: generating a replacement command for a data value of at least one data item of the plurality of data items; replacing the data value of the at least one data item with replaced data value, based on the replacement command; scanning the replaced data value; and detecting an error in at least one data item of the plurality of data items, based on the replaced data value.

According to another aspect of the disclosure, a debugging device includes: a scan chain configured to receive a plurality of data items from a memory device and to generate scan-out data for the plurality of data items; and a controller configured to replace the scan-out data with replaced data, wherein the scan chain is configured to receive the replaced data from the controller.

According to another aspect of the disclosure, a method of operating a memory system for detecting an error in at least one data item of a plurality of data items, includes: receiving the plurality of data items and generating scan-out data for the plurality of data items; and replacing the scan-out data with replaced data, wherein the generating of the scan-out data includes: generating a replacement command for a data value of at least one data item of the plurality of data items; replacing the data value of the at least one data item with another data value, based on the replacement command; scanning the replaced another data value; and detecting an error in the at least one data item of the plurality of data items based on the replaced another data value.

BRIEF DESCRIPTION OF DRAWINGS

Embodiments will be more clearly understood from the following detailed description taken in conjunction with the accompanying drawings in which:

FIG. 3 illustrates a memory controller of a memory system according to an embodiment;

FIGS. 6 and 7 illustrate embodiments in which data is replaced;

FIG. 9 illustrates a debugging method according to an embodiment;

DETAILED DESCRIPTION

Hereinafter, embodiments of the disclosure will be described in detail with reference to the accompanying drawings.

Figure 1:
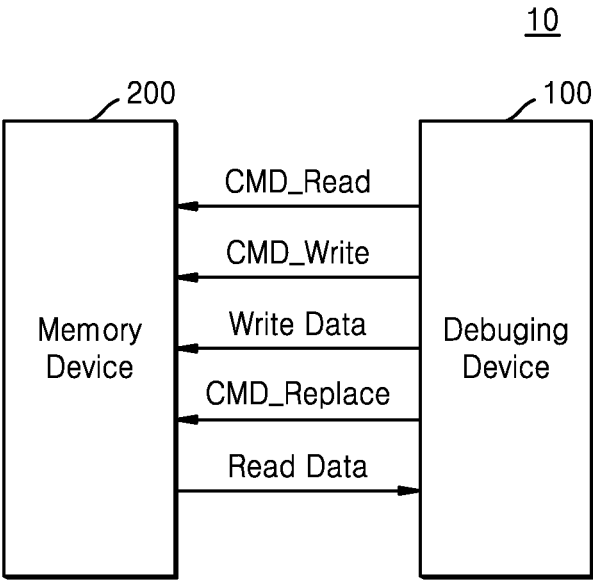
FIG. 1 illustrates a block diagram of a memory system according to an embodiment.

FIG. 1 is a block diagram of a memory system 10 according to an embodiment.

Referring to FIG. 1, the memory system 10 according to the embodiment may include a debugging device 100 and a memory device 200.

The debugging device 100 according to the embodiment may generate a read command CMD_Read or a write command CMD_Write to perform a control operation on a plurality of data items. For example, the debugging device 100 according to the embodiment may generate the read command CMD_Read, may provide the generated read command CMD_Read to the memory device 200, and may receive read data Read Data from the memory device 200. In addition, the debugging device 100 according to the embodiment may generate a write command CMD_Write and may transmit write data Write Data to the memory device 200. For example, based on determining that an error exists in at least one data item in Read Data read from the memory device 200, the debugging device 100 may generate a write command CMD_Write with a replacement command CMD_Replace and may transmit write data Write Data that replaces the read data Read Data including the at least one data item that is determined to have the error. In addition, the debugging device 100 according to the embodiment may receive data, that is the write data Write Data that has replaced the read data Read Data, by a read command CMD_Read.

The debugging device 100 according to the embodiment may detect an error in at least one of a plurality of data items stored in the memory device 200. The debugging device 100 according to the embodiment may generate the replacement command CMD_Replace for the plurality of data items to detect the error in at least one data item of the plurality of data items stored in the memory device 200. The replacement command according to the embodiment may include a command for inverting a data value of at least one data item of the plurality of data items. For example, when at least one data item of the plurality of data items has a logic value "1", data replaced by the replacement command may have a logic value "0".

The debugging device 100 according to the embodiment may replace at least one data item of the plurality of data items stored in the memory device 200 with another data item, based on the generated replacement command. The debugging device 100 according to the embodiment may receive the replaced data from the memory device 200 and may detect errors of the plurality of data items stored in the memory device 200. A detailed configuration of the debugging device 100 will be described in detail with reference to FIG. 2.

The memory device 200 according to the embodiment may store the plurality of data items. The memory device 200 according to the embodiment may receive a plurality of commands from the debugging device 100 and may perform a write or read operation on at least one data item of the plurality of data items. For example, the memory device 200 may receive the write command CMD_write and the write data Write Data from the debugging device 100 and may store data. In addition, the memory device 200 according to the embodiment may receive the read command CMD_Read from the debugging device 100, and may replace at least one data item of the plurality of data items with the read data Read Data to transmit the read data Read Data to the debugging device 100.

The memory device 200 according to the embodiment may include a storage device according to a disclosed embodiment. Hereinafter, the memory device 200 used in the current specification may be a term referring to the storage device. For example, the memory device 200 may include a solid state drive (SSD) device or a universal flash storage (UFS) device. The memory device 200 may include a plurality of memory cells, for example, a plurality of flash memory cells. For example, the memory device 200 may include volatile memory such as dynamic random access memory (DRAM) or static RAM (SRAM), and non-volatile memory such as electrically erasable programmable read only memory (EEPROM), ferroelectric RAM (FRAM), phase change RAM (PRAM), magnetic RAM (MRAM), or flash memory.

Figure 2:
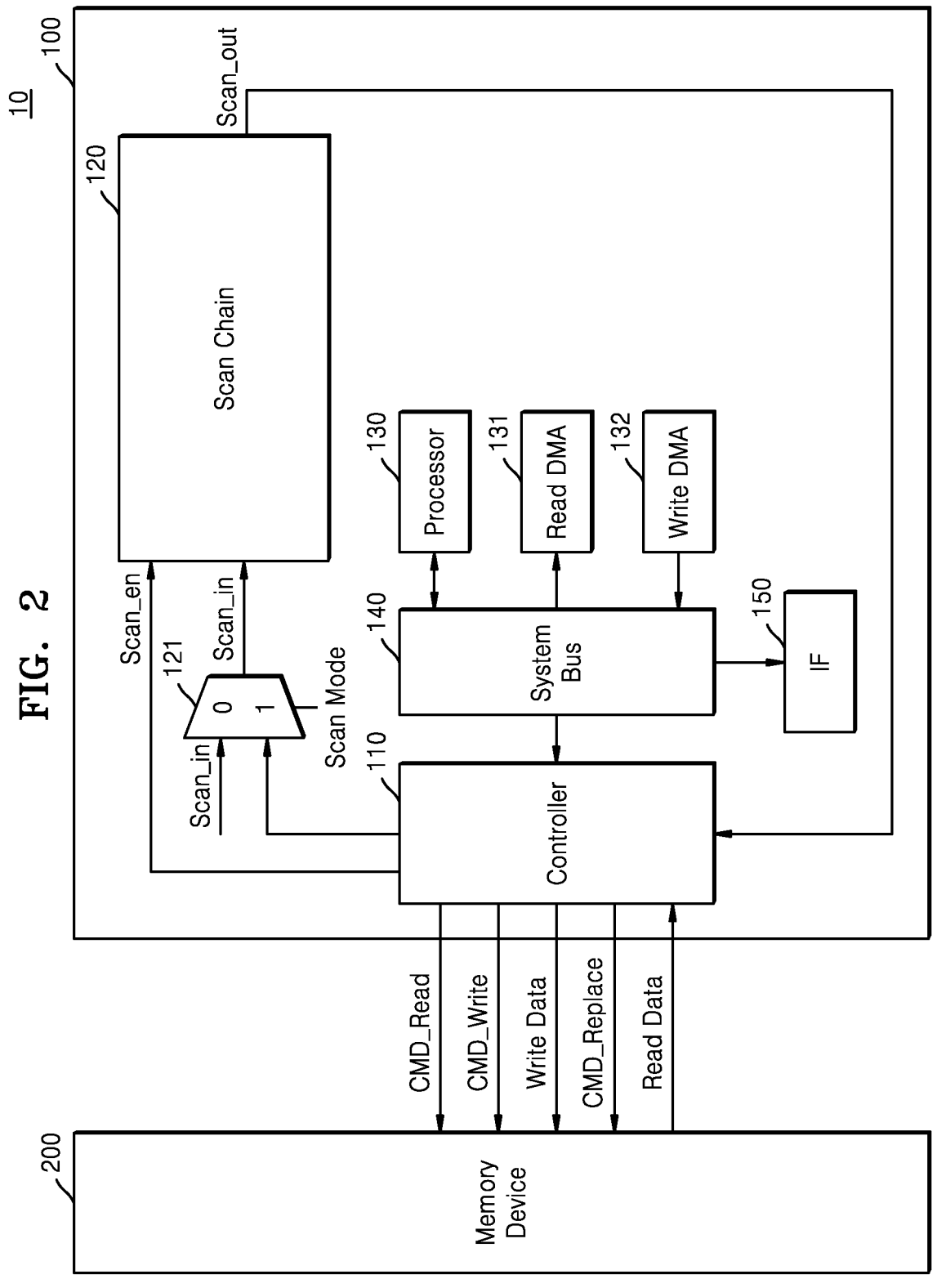
FIG. 2 illustrates a debugging device according to an embodiment.

FIG. 2 is a block diagram illustrating the debugging device 100 of the memory system 10 according to an embodiment.

Referring to FIG. 2, the debugging device 100 of the memory system 10 according to the embodiment may include a controller 110, a scan chain 120, a processor 130, a system bus 140, and an interface circuit 150. In addition, the debugging device 100 according to the embodiment may further include a multiplexer 121, a read direct memory engine Read DMA 131, and a write direct memory engine Write DMA 132.

The controller 110 according to the embodiment may receive a plurality of commands from the processor 130 and may perform a control operation on at least one data item of the plurality of data items of the memory device 200. For example, the controller 110 may receive a replacement command from the processor 130 and may replace the data value of at least one data item of the plurality of data items of the memory device 200 with another data value, based on the received replacement command. When the data value of at least one data item of the plurality of data items stored in the memory device 200 is "0", the controller 110 according to the embodiment may replace the data value of at least one data item of the plurality of data items with the another data value, "1". In addition, when the data value of at least one data item of the plurality of data items stored in the memory device 200 is "1", the controller 110 according to the embodiment may replace the data value of at least one data item of the plurality of data items with the another data value, "0".

The controller 110 according to the embodiment may convert at least one data item of the plurality of data items stored in the memory device 200 into serial data. The serial data may include data sequentially output in a unit of a single bit. For example, the controller 110 may convert at least one replaced data into the serial data. The controller 110 according to the embodiment may convert the at least one replaced data into the serial data and may use the serial data as an input signal Scan_in of the scan chain 120.

The controller 110 according to the embodiment may convert scan-out data Scan_out of the scan chain 120 into parallel data to be received in a unit of multi-bits to receive the scan-out data Scan_out. For example, the controller 110 may receive the scan-out data Scan_out having serial data characteristics from the scan chain 120, may perform an operation of converting the scan-out data Scan_out into the parallel data, and may parallelize the scan-out data Scan_out to transmit the parallelized scan-out data Scan_out to the memory device 200. The controller 110 according to the embodiment may receive the parallelized scan-out data Scan_out and may transmit the received scan-out data Scan_out to the processor 130. As described later, the processor 130 may analyze the received scan-out data Scan_out and may determine whether an error exists in at least one data item of the plurality of data items stored in the memory device 200.

The scan chain 120 according to the embodiment may receive the replaced data value. The scan chain 120 according to the embodiment may include a plurality of flip-flops. The scan chain 120 according to the embodiment may be activated by a clock control signal CLK_Ctrl and a 'scan chain enable signal' Scan_en. For example, when the clock control signal CLK_Ctrl and the scan chain enable signal Scan_en are input, the scan chain 120 may be activated to output the scan-out data Scan_out.

When the replaced data value is input from the controller 110, the scan chain 120 according to the embodiment may receive the scan chain enable signal Scan_en. When the input of the replaced data value is terminated, the scan chain 120 according to the embodiment may stop receiving the scan chain enable signal Scan_en. For example, the controller 110 may input the scan chain enable signal Scan_en to the scan chain 120 while transmitting the replaced data value to the scan chain 120. In addition, the controller 110 may stop inputting the scan chain enable signal Scan_en to the scan chain 120 while stopping transmitting the replaced data value to the scan chain 120.

The multiplexer 121 according to the embodiment may adjust an input of the scan chain 120 based on a mode control signal. For example, when a scan mode control signal Scan Mode is input to the multiplexer 121, the scan chain 120 may receive an input signal Scan_in and may operate in a scan mode.

When the replaced data is input from the controller 110, the multiplexer 121 may activate the scan chain 120 so that the debugging device 100 operates in the scan mode and may input a clock signal to the scan chain 120. A method of controlling the clock signal will be described in detail with reference to FIG. 5.

The processor 130 according to the embodiment may generate the replacement command for the plurality of data items. For example, based on an error existing in at least one data item of the plurality of data items stored in the memory device 200, the processor 130 may generate the replacement command. The replacement command according to the embodiment may include inverting the data value of at least one data item of the plurality of data items. For example, when the data value of at least one data item of the plurality of data items stored in the memory device 200 is "0", the data value of at least one data item of the plurality of data items may be replaced with "1" based on the replacement command. When the data value of at least one data item of the plurality of data items stored in the memory device 200 is "1", the data value of at least one data item of the plurality of data items may be replaced with "0" based on the replacement command.

The processor 130 according to the embodiment may include a processor such as a central processing unit (CPU). For example, the processor 130 may analyze whether an error exists in at least one data item of the plurality of data items stored in the memory device 200, and may control the debugging device 100 to activate the scan chain 120 based on the analysis result. The debugging device 100 according to the embodiment may include the read direct memory engine Read DMA 131 or the write direct memory engine Write DMA 132 to speed up a read or write operation for the plurality of data items stored in the memory device 200. For example, based on an error existing in at least one data item of the plurality of data items stored in the memory device 200, the debugging device 100 may transmit the pre-stored read command CMD_Read to the controller 110 through the read direct memory engine Read DMA 131 without going through the processor 130. In addition, based on an error existing in at least one data item of the plurality of data items stored in the memory device 200, the debugging device 100 according to the embodiment may transmit the pre-stored write command CMD_Write to the controller 110 through the write direct memory engine Write DMA 132 without going through the processor 130.

The system bus 140 according to the embodiment may operate as an interface connecting the controller 110 to the processor 130. In addition, the system bus 140 according to the embodiment may operate as an interface connecting the read direct memory engine Read DMA 131 or the write direct memory engine Write DMA 132 to the controller 110, by or to which a plurality of commands or data items may be received or transmitted. The system bus 140 according to the embodiment may be connected to the interface circuit 150. For example, the interface circuit 150 according to the embodiment may include a joint test action group (JTAG) interface circuit. The interface circuit 150 according to the embodiment may read at least one data item of the plurality of data items to determine whether an error exists in at least one data item of the plurality of data items by an external configuration (not shown).

Figure 3:
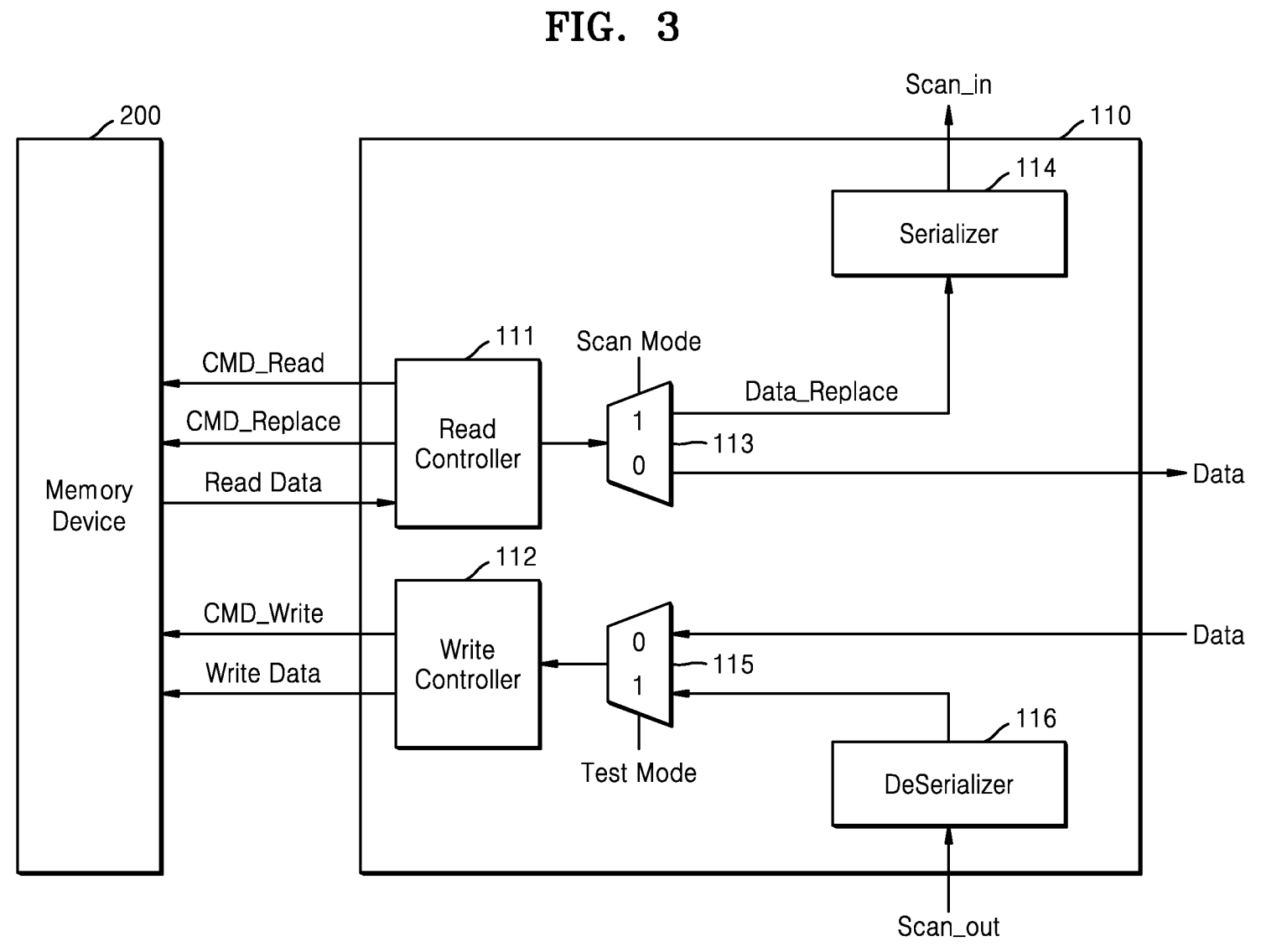

FIG. 3 is a block diagram illustrating the controller 110 of the memory system 10 according to an embodiment.

Referring to FIG. 3, the controller 110 according to the embodiment may include a read controller 111, a write controller 112, a read data control engine 113, a serializer 114, a write data control engine 115, and a deserializer 116.

The read controller 111 according to the embodiment may read at least one data item of the plurality of data items stored in the memory device 200 and may generate replacement data Data_Replace of the read data. For example, the read controller 111 may transmit the read command CMD_Read or the replacement command CMD_Replace to the memory device 200 and may receive at least one data item of the plurality of data items from the memory device 200. The read controller 111 according to the embodiment may determine the data value of the received at least one data and may transmit the received at least one data to the read data control engine 113 to replace the data value with another data value.

The write controller 112 according to the embodiment may generate the write command CMD_Write and may transmit the write data Write Data to the memory device 200. For example, the write controller 112 according to the embodiment may receive the scan-out data Scan_out in a unit of multi-bits. The write controller 112 according to the embodiment may receive data analyzed by the processor 130 and may write the data in the memory device 200. In addition, based on an error existing in at least one of the data items read from the memory device 200, the write controller 112 according to the embodiment may generate the write command CMD_Write and may transmit the write data Write Data with the read data Read Data replaced to replace the data of the memory device 200.

The read data control engine 113 according to the embodiment may receive the scan mode control signal Scan Mode and may have the debugging device 100 operate in the scan mode. The scan mode according to the embodiment may include a process of extracting data by replacing at least one of the read data items and inputting the replaced data to the scan chain.

For example, the read data control engine 113 may receive the read data Read Data in the scan mode, may replace the received read data Read Data, and may transmit the replacement data Data_Replace of the read data Read Data to the serializer 114. When the read data Read Data is "0", the read data control engine 113 according to the embodiment may generate the replacement data Data_Replace having a logic value "1". When the read data Read Data is "1", the read data control engine 113 according to the embodiment may generate the replacement data Data_Replace having a logic value "0".

The serializer 114 according to the embodiment may receive the replacement data Data_Replace of the read data Read Data and may convert the replacement data Data_Replace into the serial data. The serializer 114 according to the embodiment may convert at least one data item of the plurality of data items stored in the memory device 200 into the serial data sequentially output in a unit of a single bit. The serializer 114 according to the embodiment may convert the at least one replacement data Data_Replace into the serial data and may use the serial data as the input signal Scan_in of the scan chain 120.

The write data control engine 115 according to the embodiment may receive a test mode control signal Test Mode and may have the debugging device 100 operate in the scan mode. A test mode according to the embodiment may refer to a mode in which an error existing in data is determined by writing the replaced data in at least one of the plurality of memory cells of the memory device 200.

For example, the read data control engine 113 may convert the scan-out data Scan_out into the parallel data so that the scan-out data Scan_out is received in parallel in a unit of multi-bits in the test mode to receive the scan-out data Scan_out. The scan-out data Scan_out according to the embodiment may be a set of data items including a single bit, and may be input together with data 'Data' analyzed whether an error exists. For example, when the scan-out data Scan_out and the analyzed data 'Data' are simultaneously input or have the same data value, the write data control engine 115 according to the embodiment may receive the analyzed data 'Data'. However, when the scan-out data Scan_out and the analyzed data 'Data' according to the embodiment are not simultaneously input or do not have the same data value, the write data control engine 115 according to the embodiment may receive the scan-out data Scan_out.

The deserializer 116 according to the embodiment may convert the scan-out data Scan_out having the serial data characteristics into the parallel data. For example, the deserializer 116 may receive the scan-out data Scan_out having the serial data characteristics, may convert the scan-out data Scan_out into the parallel data, and may parallelize the scan-out data Scan_out to transmit the parallelized scan-out data Scan_out to the write data control engine 115. The write data control engine 115 according to the embodiment may receive the parallelized scan-out data Scan_out and may transmit the received scan-out data Scan_out to the write controller 112.

Figure 4:
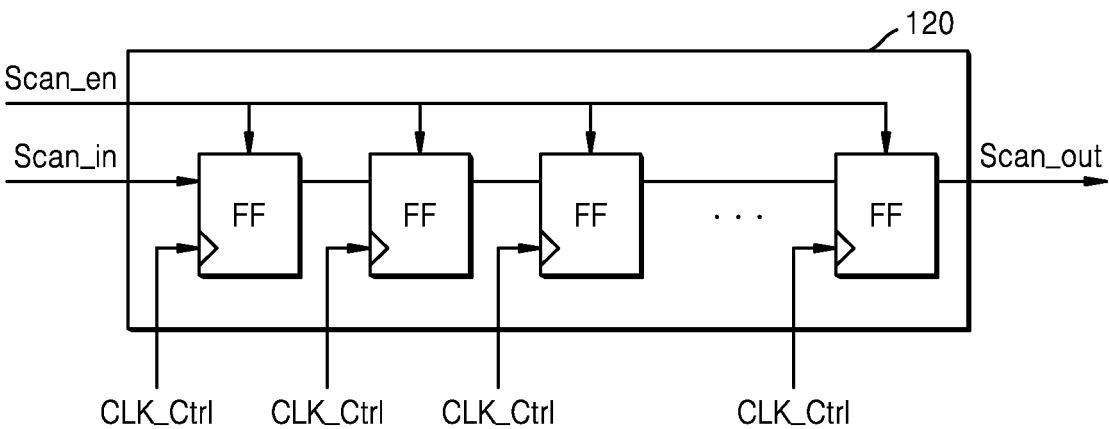
FIG. 4 illustrates a scan chain of a memory system according to an embodiment.

FIG. 4 is a block diagram illustrating the scan chain 120 of the memory system 10 according to an embodiment.

The scan chain 120 according to the embodiment may include a plurality of flip-flops FF. Each of the plurality of flip-flops FF may receive the input signal Scan_in of the scan chain 120 and may store a data value in a unit of a single bit. The plurality of flip-flops FF according to the embodiment may be activated by the clock control signal CLK_Ctrl and the scan chain enable signal Scan_en. For example, when the clock control signal CLK_Ctrl having a logic value "1" is input and the scan chain enable signal Scan_en is input, data items stored in the plurality of flip-flops FF may be output. However, when the clock control signal CLK_Ctrl having a logic value "0" is input, although the scan chain enable signal Scan_en is input, the data items stored in the plurality of flip-flops FF may not be output. The data items stored in the plurality of flip-flops FF to be output may constitute the scan-out data Scan_out. The scan chain 120 according to the embodiment may sequentially output the data items stored in the plurality of flip-flops FF in the form of serial data.

Figure 5:
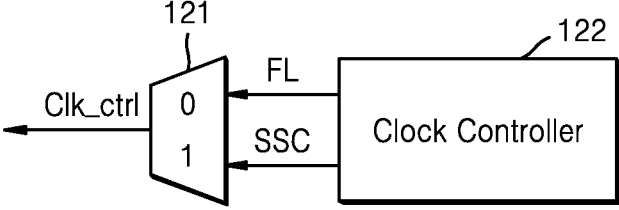
FIG. 5 illustrates generation of a clock control signal in a memory system according to an embodiment.

FIG. 5 is a diagram illustrating generation of the clock control signal CLK_Ctrl in the memory system 10 according to an embodiment.

Referring to FIG. 5, the clock control signal CLK_Ctrl according to the embodiment may be transmitted by the multiplexer 121 and may be generated based on a clock controller 122.

The multiplexer 121 according to the embodiment may receive a basic clock FL or a clock shift signal SSC from the clock controller 122 and may generate the clock control signal CLK_Ctrl. Based on an error existing in at least one data item of the plurality of data items read from the memory device 200, the clock controller 122 according to the embodiment may generate the clock shift signal SSC and the clock control signal CLK_Ctrl having the logic value "1" in order to detect the error in the at least one data. The clock control signal CLK_Ctrl according to the embodiment may be input to the plurality of flip-flops FF of the scan chain 120 described in FIG. 4, and the data items stored in the plurality of flip-flops FF may be output.

The clock controller 122 according to the embodiment may generate a basic clock FL signal when it is determined that no error exists in at least one of the plurality of read data items. The basic clock FL signal according to the embodiment may have a logic value "0". In a basic clock FL section according to the embodiment, the clock control signal CLK_Ctrl may not be input to the plurality of flip-flops FF of the scan chain 120 described in FIG. 4, and the data items stored in the plurality of flip-flops FF may be maintained.

Figure 7:
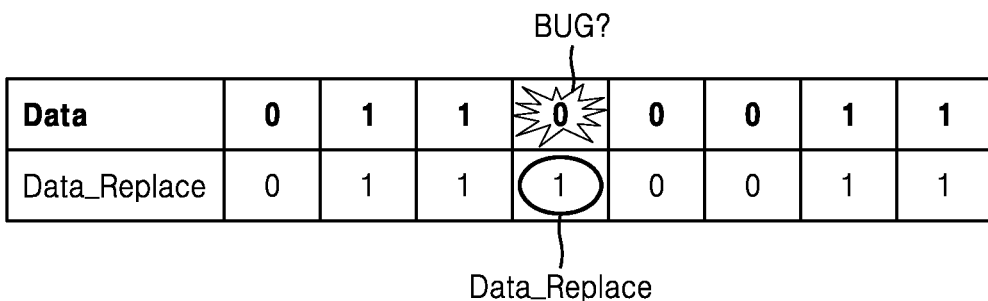

FIGS. 6 and 7 illustrate that data is replaced in the memory system 10 according to an embodiment.

Referring to FIG. 6, data 'Data' according to the embodiment may include a plurality of bits. Replacement data Data_Replace according to the embodiment may be configured such that all of the plurality of bits are replaced in the data 'Data' stored in the memory device 200. For example, when the data 'Data' has a logic value "01100011", the replacement data Data_Replace may have a logic value "10011100".

Referring to FIG. 7, the data 'Data' according to the embodiment may include the plurality of bits, and a part in which an error (bug) occurs may be one data value. The replacement data Data_Replace according to the embodiment may be configured such that at least one of the plurality of bits is replaced in the data 'Data' stored in the memory device 200. For example, when the data 'Data' has a logic value "01100011" and one data having a logic value "0" is determined to be an error, the replacement data Data_Replace may have a logic value "01110011" in which only the part having the error is replaced. The debugging device 100 according to the embodiment may detect an error existing in the data 'Data' by analyzing the replacement data Data_Replace.

Figure 8:
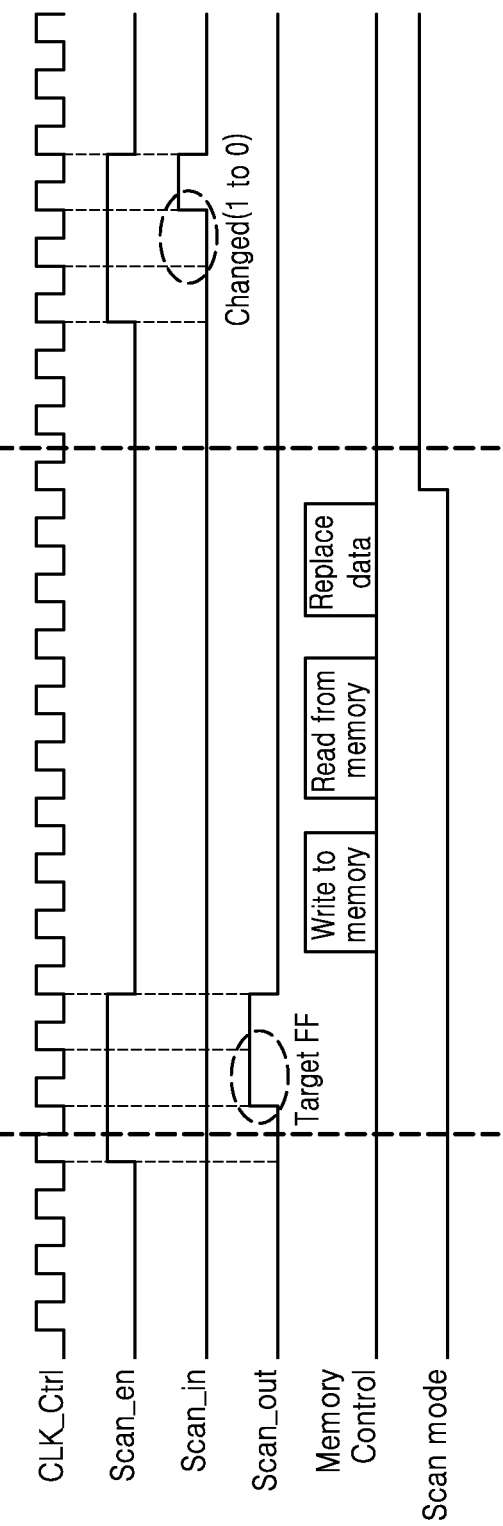
FIG. 8 illustrates a clock timing diagram according to a debugging method according to an embodiment.

FIG. 8 is a clock timing diagram according to a debugging method according to an embodiment.

In the debugging device 100 according to the embodiment, the clock control signal CLK_Ctrl having a regular interval may be input to the scan chain 120. The debugging device 100 according to the embodiment may operate in a normal mode or a scan mode. In the normal mode according to the embodiment, the input signal Scan_in is not input to the scan chain 120 because it is determined that no error exists in the plurality of data items. In the scan mode Scan Mode according to the embodiment, the input signal Scan_in is not input to the scan chain 120 because it is determined that an error exists in at least one data item of the plurality of data items.

In the debugging device 100 according to the embodiment, the scan chain enable signal Scan_en may be used for a target flip-flop Target FF to determine whether an error exists in at least one data item of the plurality of data items. When the scan chain enable signal Scan_en and the clock control signal CLK_Ctrl are input, the debugging device 100 according to the embodiment may output the scan-out data Scan_out. However, when the scan chain enable signal Scan_en is input and the clock control signal CLK_Ctrl is not input, the debugging device 100 according to the embodiment may not output the scan-out data Scan_out.

When the scan-out data Scan_out is output, the debugging device 100 according to the embodiment may generate a memory control signal Memory Control and may perform a data write operation Write to memory on the memory device 200. When the data write operation Write to memory is completed, the debugging device 100 according to the embodiment may perform a data read operation Read from memory of reading data from the memory device 200. When the data is read, the debugging device 100 according to the embodiment may perform a data replacement operation Replace data of replacing the read data.

When the read data is replaced, the debugging device 100 according to the embodiment may enter the scan mode Scan Mode. The replaced data according to the embodiment may be the input signal Scan_in of the scan chain 120. The input signal Scan_in of the scan chain 120 according to the embodiment may be a signal Changed in which data of a part determined to have an error is replaced. For example, the input signal Scan_in of the scan chain 120 may be a signal Changed (1 to 0) in which data having a logic value "1" is replaced with a logic value "0" as illustrated in FIG. 8.

FIG. 9 is a flowchart of a debugging method of the memory system 10 according to an embodiment.

The debugging method of the memory system 10 according to the embodiment may include receiving a plurality of data items, generating scan-out data Scan_out for the plurality of data items, and replacing the scan-out data Scan_out.

In order to generate the scan-out data Scan_out, the memory system 10 according to the embodiment may generate a replacement command for a data value of at least one data item of the plurality of data items in operation S910.

The memory system 10 according to the embodiment may detect an error in at least one data item of the plurality of data items stored in the memory device 200 through the debugging device 100. The debugging device 100 according to the embodiment may generate the replacement command CMD_Replace for the plurality of data items to detect the error in at least one data item of the plurality of data items stored in the memory device 200. The replacement command according to the embodiment may include a command for inverting at least one data item of the plurality of data items. For example, when at least one data item of the plurality of data items has a logic value "1", the data replaced by the replacement command may have a logic value "0".

When the replacement command is generated, the memory system 10 according to the embodiment may receive the replacement command and may replace the data value of at least one data item of the plurality of data items based on the replacement command in operation S920.

The memory system 10 according to the embodiment may perform a control operation on at least one data item of the plurality of data items. For example, the memory system 10 may replace the data value of at least one data item of the plurality of data items of the memory device 200 based on the replacement command. When the data value of at least one data item of the plurality of data items stored in the memory device 200 is "0", the memory system 10 according to the embodiment may replace the data value of at least one data item of the plurality of data items with another data value, "1". In addition, when the data value of at least one data item of the plurality of data items stored in the memory device 200 is "1", the memory system 10 according to the embodiment may replace the data value of at least one data item of the plurality of data items with another data value, "0".

When the data value of at least one data item of the plurality of data items is replaced, the memory system 10 according to the embodiment may convert the at least one replaced data of the plurality of data items into serial data in the form of a single bit in operation S930.

The memory system 10 according to the embodiment may convert at least one data item of the plurality of data items stored in the memory device 200 into the serial data sequentially output in a unit of a single bit. For example, the memory system 10 may convert the at least one replaced data into the serial data sequentially output in a unit of a single bit.

When the at least one replaced data of the plurality of data items is converted into the serial data in the form of a single bit, the scan chain 120 of the memory system 10 according to the embodiment may receive the replaced data value and may scan the replaced data value in operation S940.

The controller 110 according to the embodiment may convert the at least one replaced data into the serial data in the form of a single bit and may use the serial data as the input signal Scan_in of the scan chain 120. The memory system 10 according to the embodiment may store a data value in the form of a single bit in each of the plurality of flip-flops by receiving the serial data in the form of a single bit. When the scan operation is performed, the memory system 10 according to the embodiment may sequentially read the data items stored in the plurality of flip-flops.

When the scan operation for the replaced data is completed, the memory system 10 according to the embodiment may convert the output of the scan chain 120 into parallel data in the form of a multi-bit in operation S950.

The output of the scan chain 120 according to the embodiment may be referred to as the scan-out data Scan_out. The memory system 10 according to the embodiment may convert the scan-out data Scan_out into the parallel data to be received in parallel in a unit of multi-bits to receive the scan-out data Scan_out.

For example, the memory system 10 may perform an operation of converting the scan-out data Scan_out into the parallel data and may parallelize the scan-out data Scan_out. The controller 110 according to the embodiment may receive the parallelized scan-out data Scan_out and may analyze the received scan-out data Scan_out.

When the output of the scan chain 120 is converted into the parallel data in the form of a multi-bit, the memory system 10 according to the embodiment may detect an error in at least one data item of the plurality of data items based on the replaced data value in operation S960.

For example, when the memory device 200 is operated by the replaced data according to the embodiment, the memory system 10 may determine that an error exists in the basic data of the replaced data. However, when the memory device 200 is not operated by the replaced data according to the embodiment, the memory system 10 may determine that no error exists in the basic data of the replaced data and may perform a replacement operation on another data item.

Figure 10:
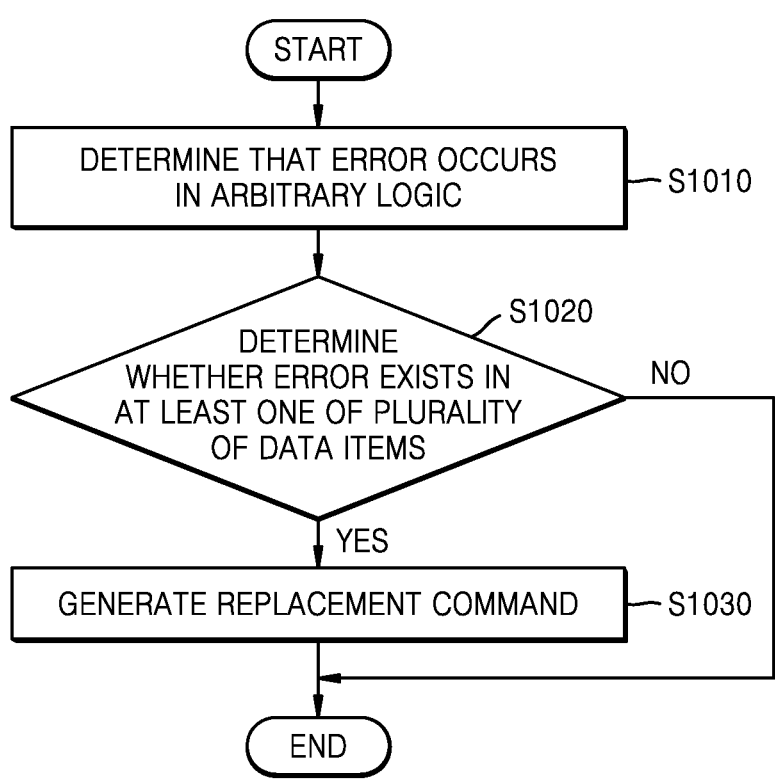
FIG. 10 illustrates a process of generating a replacement command in a debugging method according to an embodiment.

FIG. 10 is a flowchart illustrating a process of generating a replacement command in a debugging method according to an embodiment.

The memory system 10 according to the embodiment may determine that an error occurs in an arbitrary logic in operation S1010. The memory system 10 according to the embodiment may determine that an error occurs in an arbitrary logic when a preset result is not derived from the data read from the memory device 200.

When it is determined that an error occurs in an arbitrary logic, the memory system 10 according to the embodiment may determine whether an error exists in at least one data item of the plurality of data items in operation S1020. The memory system 10 according to the embodiment may read the data items stored in the plurality of flip-flops of the scan chain 120 to determine whether an error exists in at least one data item of the plurality of data items. For example, the memory system 10 may input the scan chain enable signal Scan_en to the target flip-flop Target FF to determine whether an error exists in at least one data item of the plurality of data items. When the scan chain enable signal Scan_en is input, the memory system 10 according to the embodiment may output the scan-out data Scan_out stored in the target flip-flop Target FF.

Based on an error existing in at least one data item of the plurality of data items, the memory system 10 according to the embodiment may generate the replacement command in operation S1030. The replacement command according to the embodiment may include a command for inverting at least one data item of the plurality of data items. For example, when at least one data item of the plurality of data items has a logic value "1", the data replaced by the replacement command may have a logic value "0". However, when it is determined that no error exists in at least one data item of the plurality of data items, the debugging operation may be terminated without performing the replacement operation.

Figure 11:
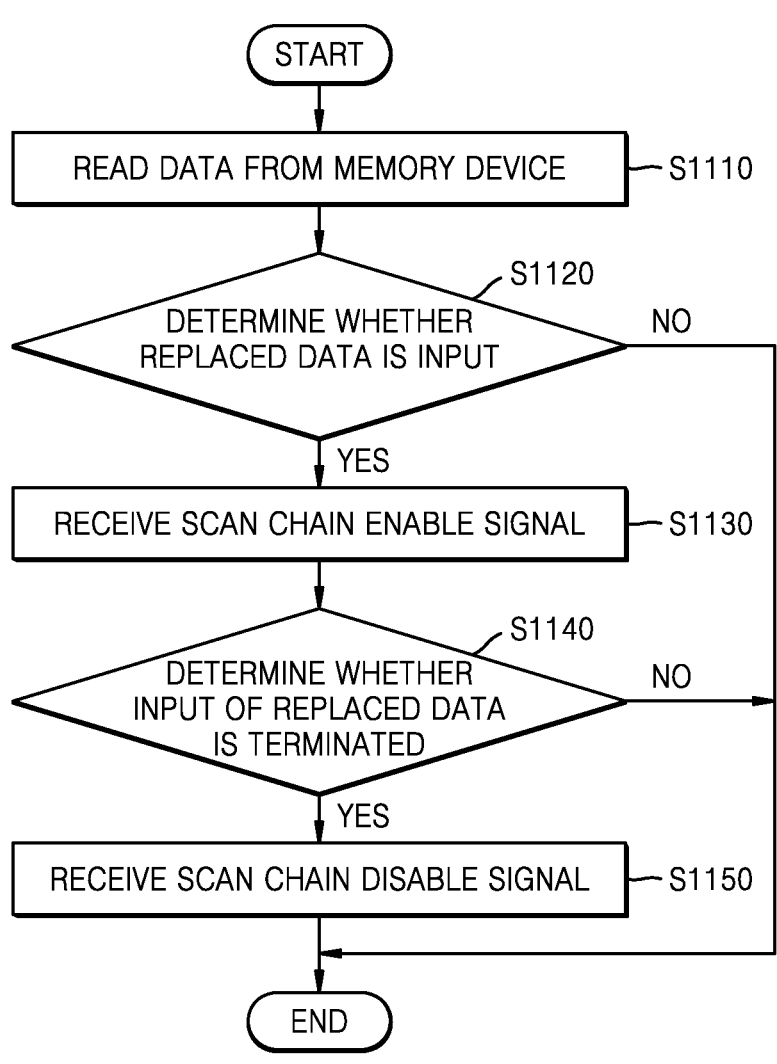
FIG. 11 illustrates an operation of a scan chain in a debugging method according to an embodiment.

FIG. 11 is a flowchart illustrating an operation of the scan chain 120 in a debugging method according to an embodiment.

The memory system 10 according to the embodiment may read data from the memory device 200 in operation S1110. For example, in the memory system 10 according to the embodiment, the debugging device 100 may generate the read command CMD_Read, may provide the generated read command CMD_Read to the memory device 200, and may receive the read data Read Data from the memory device 200.

When the data is read from the memory device 200, the memory system 10 according to the embodiment may determine whether the replaced data is input to the scan chain 120 in operation S1120. The memory system 10 according to the embodiment may convert at least one data item of the plurality of data items stored in the memory device 200 into the serial data sequentially output in a unit of a single bit. For example, the memory system 10 may convert the at least one replaced data into the serial data sequentially output in a unit of a single bit. The memory system 10 according to the embodiment may convert the at least one replaced data into the serial data and may use the serial data as the input signal Scan_in of the scan chain 120.

When it is determined that the replaced data is input to the scan chain 120, the scan chain 120 of the memory system 10 according to the embodiment may receive the scan chain enable signal Scan_en in operation S1130. For example, the memory system 10 may input the scan chain enable signal Scan_en to the scan chain 120 while transmitting the replaced data value to the scan chain 120.

When the scan chain enable signal Scan_en is input, the memory system 10 according to the embodiment may determine whether the input of the replaced data is terminated in operation S1140. When it is determined that the input of the replaced data is terminated, the memory system 10 according to the embodiment may deactivate the scan chain 120 in operation S1150.

When the input of the replaced data value is terminated, the scan chain 120 according to the embodiment may stop receiving the scan chain enable signal Scan_en. For example, the memory system 10 may input the scan chain enable signal Scan_en to the scan chain 120 while transmitting the replaced data value to the scan chain 120. In addition, the memory system 10 may stop inputting the scan chain enable signal Scan_en to the scan chain 120 while stopping transmitting the replaced data value to the scan chain 120.

Figure 12:
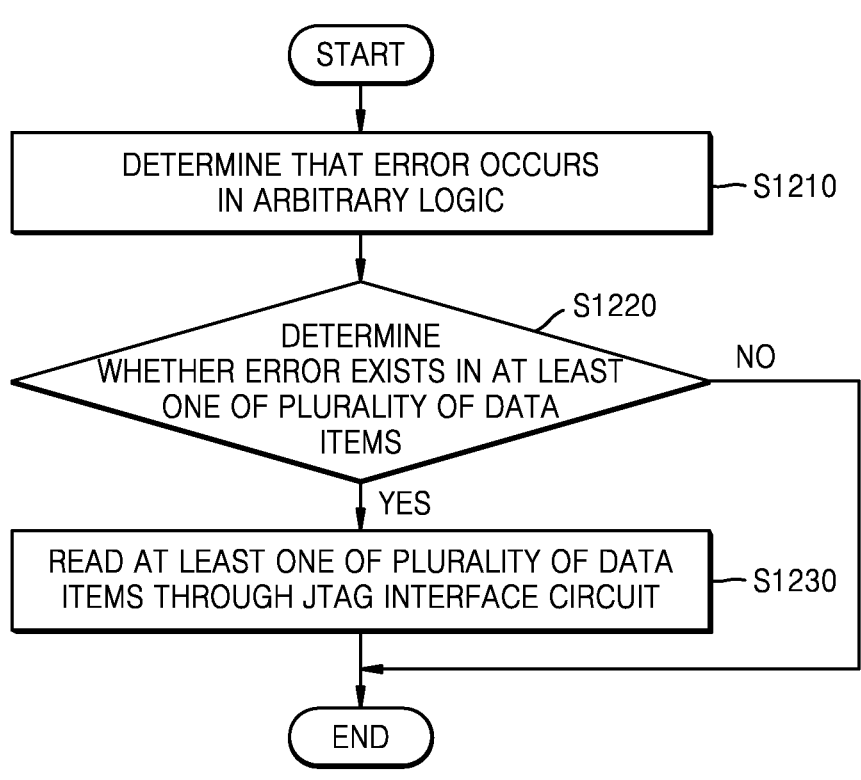
FIG. 12 illustrates a process of reading data through a joint test action group (JTAG) interface circuit in a debugging method according to an embodiment.

FIG. 12 is a flowchart illustrating a process of reading data through a JTAG interface circuit in a debugging method according to an embodiment.

Referring to FIG. 12, the memory system 10 according to the embodiment may determine whether an error occurs in an arbitrary logic in operation S1210. The memory system 10 according to the embodiment may determine that an error occurs in an arbitrary logic when a preset result is not derived from the data read from the memory device 200.

When it is determined that an error occurs in an arbitrary logic, the memory system 10 according to the embodiment may determine whether an error exists in at least one data item of the plurality of data items in operation S1020. The memory system 10 according to the embodiment may read the data items stored in the plurality of flip-flops of the scan chain 120 to determine whether an error exists in at least one data item of the plurality of data items. For example, the memory system 10 may input the scan chain enable signal Scan_en to the target flip-flop Target FF to determine whether an error exists in at least one data item of the plurality of data items. When the scan chain enable signal Scan_en is input, the memory system 10 according to the embodiment may output the scan-out data Scan_out stored in the target flip-flop Target FF.

Based on an error existing in at least one data item of the plurality of data items, the memory system 10 according to the embodiment may read at least one data item of the plurality of data items through the JTAG interface circuit in operation S1230. When at least one data item of the plurality of data items is read by the JTAG interface circuit, the JTAG interface circuit according to the embodiment may analyze the read data through an external configuration (not shown). The external configuration according to the embodiment may include a JTAG port. However, the disclosure is not limited thereto.

While the disclosure has been particularly shown and described with reference to embodiments thereof, it will be understood that various changes in form and details may be made therein without departing from the spirit and scope of the following claims.

What is claimed is:

1. A memory system comprising:
a memory device configured to store a plurality of data items;

a processor configured to generate a replacement command based on a determination that an error exists in at least one data item of the plurality of data items;

a controller configured to receive the replacement command from the processor and to replace a first data value of the at least one data item of the plurality of data items with a second data value based on the replacement command; and a scan chain configured to receive the plurality of data items including the second data value from the controller and to generate scan-out data corresponding to the plurality of data items including the second data value, wherein the first data value of the at least one data item comprises a first bit value, wherein the second data value comprises a second bit value, and wherein the replacement command includes a command for inverting the first bit value to the second bit value.

2. The memory system of claim 1, wherein the controller comprises a serializer configured to convert at least one replaced data of the plurality of data items into serial data sequentially output in a unit of a bit.

3. The memory system of claim 2, wherein the scan chain is configured to receive the serial data.

4. The memory system of claim 1, wherein the controller further comprises a deserializer configured to convert the scan-out data into parallel data to be received in parallel in a unit of multi-bits.

5. The memory system of claim 1, wherein the scan chain is configured to receive a scan chain enable signal, based on the plurality of data items received by the scan chain.

6. The memory system of claim 5, wherein the scan chain is configured to stop receiving the scan chain enable signal, based on a condition that the scan chain terminates a reception of the plurality of data items.

7. The memory system of claim 1, further comprising a joint test action group (JTAG) interface circuit, wherein, based on the error existing in the at least one data item of the plurality of data items, the at least one data item of the plurality of data items is read through the JTAG interface circuit.

8. The memory system of claim 1, wherein the controller is further configured to receive second scan-out data from the scan chain and store the second scan-out data as the plurality of data items in the memory device before the processor generates the replacement command.

9. A debugging method of a memory system for detecting an error in at least one data item of a plurality of data items stored in a memory device of the memory system, the debugging method comprising:

generating, by a processor, a replacement command for a first data value of the at least one data item of the plurality of data items based on a determination of the error existing in the at least one data item of the plurality of data items;

receiving, by a controller, the replacement command from the processor;

replacing, by the controller, the first data value of the at least one data item of the plurality of data items with a second data value based on the replacement command;

receiving, by a scan chain, the plurality of data items including the second data value; and generating, by the scan chain, scan-out data corresponding to the plurality of data items including the second data value, wherein the first data value of the at least one data item comprises a first bit value, wherein the second data value comprises a second bit value, and wherein the replacement command includes a command for inverting the first bit value to the second bit value.

10. The debugging method of claim 9, further comprising converting the second data value into data in a form of a single bit.

11. The debugging method of claim 10, wherein the generating, by the scan chain, the scan-out data comprises scanning the second data value, and wherein, in the scanning of the second data value, the converted second data value in the form of the single bit is received.

12. The debugging method of claim 9, further comprising converting an output of the scan chain into another data in a form of multi-bits.

13. The debugging method of claim 9, further comprises receiving a scan chain enable signal, based on the second data value that is an input.

14. The debugging method of claim 13, wherein the generating, by the scan chain, the scan-out data comprises scanning the second data value, and wherein, in the receiving of the scan chain enable signal and the scanning of the second data value, a scan chain disable signal is received, based on a condition that the input is terminated.

15. The debugging method of claim 9, further comprising reading the at least one data item of the plurality of data items through a joint test action group (JTAG) interface circuit, based on the error existing in the at least one data item of the plurality of data items.

16. The debugging method of claim 9, further comprising:

receiving, by the controller, second scan-out data from the scan chain; and storing, by the controller, the second scan-out data as the plurality of data items in the memory device before the processor generates the replacement command.

17. A debugging device comprising:

a processor configured to generate a replacement command based on a determination that an error exists in at least one data item of a plurality of data items stored in a memory;

a controller configured to receive the replacement command from the processor and to replace a first data value of the at least one item of the plurality of data items with a second data value; and a scan chain configured to receive, from the controller, the plurality of data items including the second data value and to generate scan-out data corresponding to the plurality of data items including the second data value, wherein the first data value of the at least one data item comprises a first bit value, wherein the second data value comprises a second bit value, and wherein the replacement command includes a command for inverting the first bit value to the second bit value.

18. The debugging device of claim 17, wherein the controller comprises a serializer configured to convert the second data value into serial data sequentially output in a unit of a single bit.

19. The debugging device of claim 17, wherein the controller is further configured to receive second scan-out data from the scan chain and store the second scan-out data as the plurality of data items in the memory before the processor generates the replacement command.

* * * * *